United States Patent
Huang et al.

(10) Patent No.: US 11,294,011 B2
(45) Date of Patent: Apr. 5, 2022

(54) MAGNETIC RESONANCE IMAGING WITH DEEP NEUTRAL NETWORKS

(71) Applicant: Shanghai Neusoft Medical Technology Co., Ltd., Shanghai (CN)

(72) Inventors: Feng Huang, Shanghai (CN); Dong Han, Shanghai (CN); Ling Mei, Shanghai (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 51 days.

(21) Appl. No.: 16/735,874

(22) Filed: Jan. 7, 2020

(65) Prior Publication Data
US 2020/0217914 A1    Jul. 9, 2020

(30) Foreign Application Priority Data
Jan. 8, 2019 (CN) .......................... 201910016038.0

(51) Int. Cl.
*G01R 33/561* (2006.01)
*G01R 33/48* (2006.01)
*G01R 33/56* (2006.01)

(52) U.S. Cl.
CPC ....... *G01R 33/561* (2013.01); *G01R 33/4818* (2013.01); *G01R 33/5608* (2013.01)

(58) Field of Classification Search
CPC .............. G01R 33/561; G01R 33/4818; G01R 33/5608; G01R 33/5611; A61B 5/055
See application file for complete search history.

(56) References Cited

U.S. PATENT DOCUMENTS

| | | | | |
|---|---|---|---|---|
| 2018/0189930 A1* | 7/2018 | Dannels | ........... | G01R 33/56545 |
| 2018/0285695 A1* | 10/2018 | Guo | ...................... | G06T 7/0012 |
| 2020/0126263 A1* | 4/2020 | Dinh | ...................... | H04N 19/85 |

FOREIGN PATENT DOCUMENTS

| | | |
|---|---|---|
| CN | 104569880 | 4/2015 |
| CN | 107121654 | 9/2017 |
| CN | 107182216 | 9/2017 |
| CN | 108814603 | 11/2018 |

OTHER PUBLICATIONS

CN Office Action in Chinese Appln. No. 201910016038.0, dated Sep. 29, 2020, 11 pages (with English Translation).

\* cited by examiner

*Primary Examiner* — Farhana A Hoque
(74) *Attorney, Agent, or Firm* — Fish & Richardson P.C.

(57) ABSTRACT

Methods, devices, apparatus and systems for magnetic resonance imaging with deep neural networks are provided. In one aspect, a method of magnetic resonance imaging method combines a deep neural network and an accelerated imaging manner. The method includes: scanning a subject with a first undersampling factor and a first sampling trajectory to obtain first imaging information, processing the first imaging information with the deep neural network to obtain second imaging information corresponding to a second undersampling factor that is smaller than the first undersampling factor, and reconstructing a magnetic resonance image of the subject from the second imaging information.

20 Claims, 3 Drawing Sheets

---

Scan a subject sample with a second undersampling factor to obtain third k-space data — S101

Select a part of k-space data from the third k-space data according to a first undersampling factor and a second sampling trajectory to obtain fourth k-space data — S103

Take the third k-space data as an output sample, and the fourth k-space data as an input sample, to train a previously built DNN to obtain a DNN for accelerated magnetic resonance reconstruction — S103

MAGNETIC RESONANCE IMAGING WITH DEEP NEUTRAL NETWORKS

CROSS REFERENCE TO RELATED APPLICATIONS

This application claims priority to Chinese Patent Application No. 201910016038.0 filed on Jan. 8, 2019, the entire content of which is incorporated herein by reference.

BACKGROUND

Magnetic Resonance Imaging (MRI), as a multi-parameter, multi-contrast imaging technology, is one of the main imaging methods in modern medical radiology. MRI can reflect many characteristics such as T1, T2 of tissues and proton densities, so as to provide information for detection and diagnosis of diseases. The basic operation principle of MRI is utilizing the magnetic resonance phenomenon, to excite hydrogen protons in a human body with radio frequency excitation. After encoding positions with gradient fields, electromagnetic signals having position information are received by a receiving coil, and finally image information is reconstructed through a Fourier transform.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices, systems and apparatus for magnetic resonance imaging (MRI), particularly, by combining a deep neutral network and an accelerated imaging manner to accelerate magnetic resonance scanning and to thereby speed up an overall scanning speed of the MRI.

In general, one innovative aspect of the subject matter described in this specification can be embodied in methods that include the actions of magnetic resonance imaging, including: scanning a subject with a first undersampling factor and a first sampling trajectory to obtain first imaging information; processing the first imaging information with a deep neural network (DNN) to obtain second imaging information corresponding to a second undersampling factor, the first undersampling factor being larger than the second undersampling factor; and reconstructing a magnetic resonance image of the subject from the second imaging information. The DNN can be associated with the first undersampling factor and the second undersampling factor.

Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. For example, reconstructing the magnetic resonance image of the subject from the second imaging information can include reconstructing the magnetic resonance image from the second imaging information with one of parallel imaging accelerated imaging, compressed sensing accelerated imaging, and half-Fourier accelerated imaging.

In some implementations, the actions include: before processing the first imaging information with the DNN, training the DNN with a plurality of training samples. The actions can further include: obtaining each training sample of the plurality of training samples by scanning a subject sample with the second undersampling factor to obtain third imaging information; selecting a corresponding part of information from the third imaging information according to the first undersampling factor and a second sampling trajectory to obtain fourth imaging information; and taking the third imaging information as an output sample and the fourth imaging information as an input sample to form the training sample.

In some cases, when the magnetic resonance image of the subject is reconstructed from the second imaging information with parallel imaging accelerated imaging, the first sampling trajectory is the same as the second sampling trajectory.

In some cases, when the magnetic resonance image of the subject is reconstructed from the second imaging information with half-Fourier accelerated imaging, the first sampling trajectory is the same as the second sampling trajectory.

In some cases, when the magnetic resonance image of the subject is reconstructed from the second imaging information with compressed sensing accelerated imaging, both the first sampling trajectory and the second sampling trajectory satisfy a sparse constraint condition of the compressed sensing accelerated imaging.

In some examples, the first imaging information and the second imaging information are parts of k-space data in a k-space domain.

In some examples, the first imaging information and the second imaging information are images obtained by performing a Fourier transform on parts of k-space data in a k-space domain.

The second undersampling factor is no more than an undersampling factor for accelerated imaging, for example, parallel imaging accelerated imaging, compressed sensing accelerated imaging, or half-Fourier accelerated imaging.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by

DETAILED DESCRIPTION

Figure 1:
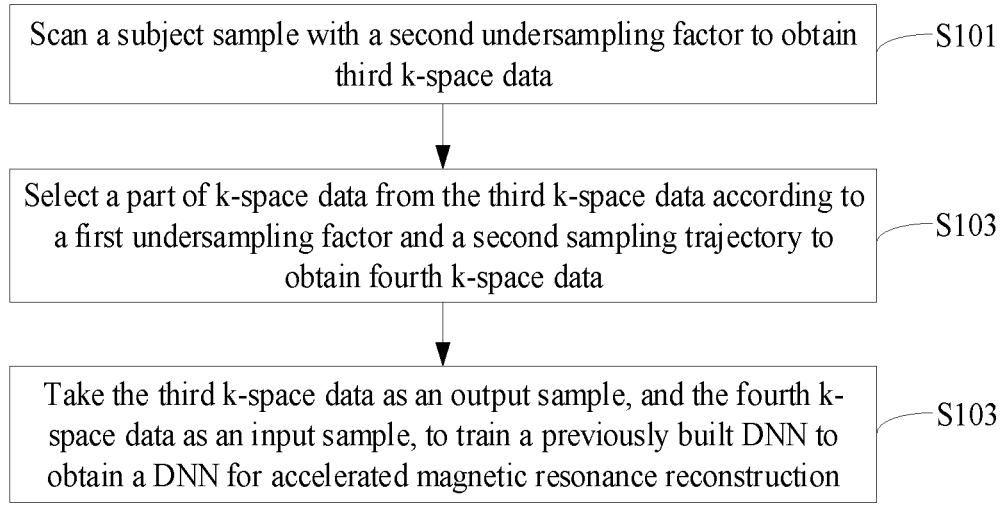
FIG. 1 is a schematic flowchart illustrating a method of training a deep neural network according to an example of the present application.

Due to a slow phase encoding speed, an overall scanning time of MRI is long, which affects the efficiency of MRI in use and the experience of patients. A Deep Neural Network (DNN) may be applied to accelerate magnetic resonance scanning to speed up the overall scanning speed of MRI. Before the DNN is put into operation, the DNN needs to be trained to obtain parameter values for each unit of the DNN. A training sample in a training sample set used in training may include two parts: one is an input sample and the other is an output sample. The input sample may be an image with low signal-to-noise ratio, and can be obtained from under-sampled magnetic resonance data. The output sample, also known as a gold standard, is usually an image with high-quality and low-noise. The image with high-quality and low-noise is generally reconstructed from full sampled or enhanced full sampled magnetic resonance data, where collecting the full sampled or enhanced full sampled magnetic resonance data takes a long time. Through deep learning of the input and output samples, a trained DNN can be obtained.

The undersampled magnetic resonance data, also known as undersampled k-space data, refers to, in a clinical practical application of MRI, only part of data collected by undersampling. For example, it is assumed that phase coding lines corresponding to k-space are 256 rows in a practical application of MRI, the undersampled k-space data is data collected from less than 256 rows of the phase coding lines, such as, data collected from 128 rows of the phase coding lines. Undersampling can effectively shorten the scanning time of MRI.

The full sampled magnetic resonance data, also known as full sampled k-space data, refers to that, in a clinical practical application of MRI, all data are collected. Also taking 256 rows of the phase coding lines corresponding to the k-space as an example, the full sampled k-space data includes all data collected from the 256 rows of the phase coding lines.

The enhanced full sampled magnetic resonance data, also known as enhanced full k-space data, includes data on more than 256 rows of the phase coding lines, for example, data on 384 rows of the phase coding lines. The 384 rows of the phase coding lines include the above-mentioned 256 rows of the phase coding lines and additional 128 rows of the phase coding lines, thereby improving the resolution of the image.

A scanning time for acquiring enhanced full sampled k-space data is longer than that for acquiring full sampled k-space data, and a scanning time for acquiring full sampled k-space data is longer than that for acquiring undersampled k-space data. For an application in which a subject has no movement or an application which does not require high time resolution, the acquisition of the training sample set required for deep learning can be done without considering the scanning time, and the output samples can be collected by full sampling or enhanced full sampling. The output samples can be full sampled or enhanced full sampled k-space data or images generated by the full sampled or enhanced full sampled k-space data. The input samples may be obtained by manually undersampling, such as, a certain percentage of data is extracted from the full sampled or enhanced full sampled k-space data. In other words, the input sample may be a subset of the output sample.

However, for some application scenarios with a limited scanning time, such as abdominal scanning, a subject needs to hold their breath during collecting magnetic resonance data, so time of collecting data (or scanning time) is limited. Thus, it is impossible to obtain full sampled k-space data in such scenarios, because the output samples cannot be obtained within one breath hold. Twice abdominal breath-holds cannot be used to obtain the output samples for each layer of images, because a diastolic state of a liver cannot be exactly the same when a person holds his breath twice and the same layer of images collected twice cannot exactly correspond to each other. Therefore, it is impossible to obtain high-quality images by holding breath multiple times. Accordingly, for application scenarios with the limited scanning time, the output samples in the training sample set of a DNN cannot be obtained, and the DNN cannot be applied to application scenarios with the limited scanning time.

Acceleration methods (or accelerated imaging) can be used in the MRI field, and can include parallel imaging, compressed sensing, half-Fourier, or the like. These magnetic resonance acceleration methods use a part of k-space data and redundant information (such as position information provided by multi-channel coils, sparse information of compressed sensing, or conjugate information used in half-Fourier, etc.) to solve a magnetic resonance image through mathematical calculations. The calculated magnetic resonance image is close to the magnetic resonance image generated by the full sampled k-space data. In an example, a magnetic resonance image can be obtained from a part of the k-space data combined with coil sensitivity maps in an image domain. In another example, in a k-space domain, complete k-space data is fitted from a part of the k-space data, and then a Fourier transform is performed to obtain a magnetic resonance image. However, for these conventional acceleration methods, acceleration multiple (or acceleration ratio) of each method is also limited. Therefore, in scenarios with strict time requirement, such as the abdomen scanning, it still cannot meet the requirements of high resolution for a clinical application.

To be able to apply a DNN in the application scenarios of MRI with limited scanning time, in the present disclosure, a DNN and an accelerated imaging manner are combined. First, the DNN is used to process first imaging information corresponding to a larger undersampling factor to obtain second imaging information corresponding to a smaller undersampling factor, and then the accelerated imaging method is used to reconstruct a magnetic resonance image from the second imaging information. As such, in the magnetic resonance imaging method provided by the present disclosure, the output samples for training the DNN are not full sampled or enhanced full sampled data, but undersampled data. Therefore, the output samples of the DNN can be obtained by an undersampling method, and can be obtained in a short scanning time. Accordingly, the DNN can be applied to MRI applications with limited scanning time, such as abdominal scanning.

To clearly understand the technical solution of the present application, specific implementations of the present application will be described in detail below with reference to the accompanying drawings.

The DNN used in the examples of the present application for accelerated MRI will be described firstly.

The DNN for accelerated magnetic resonance imaging is used to reconstruct imaging information corresponding to a low sampling rate from imaging information corresponding to an extremely low sampling rate. Thus, the output samples for training the DNN are imaging information obtained by using the accelerated magnetic resonance scanning method, and the input samples may be part of the imaging information which is extracted from the obtained imaging information. The DNN performs deep learning on input samples and output samples, that is, the DNN is trained by using a training sample set includes multiple input samples and output samples, thereby obtaining the DNN for accelerated magnetic resonance imaging.

In examples of the present application, the imaging information may be k-space data in the k-space domain, or may be an image in the image domain which is obtained by performing a Fourier transform on the k-space data.

It should be noted that the sampling rate is inversely related to the undersampling factor. The larger the undersampling factor is, the lower the sampling rate is. The lower the undersampling factor is, the higher the sampling rate is.

In the following, specific implementations of methods of training a DNN will be described respectively by taking imaging information as k-space data and convolution images as examples.

First, a specific implementation of the method of training a DNN is described, where the imaging information is the k-space data.

As shown in FIG. 1, when the imaging information is the k-space data, a process of the method of training the DNN may include the following steps.

At S101, a subject sample is scanned with a second undersampling factor to obtain third k-space data.

This step may be specifically: scanning the subject sample with an accelerated magnetic resonance imaging method to obtain third k-space data. The accelerated magnetic resonance imaging method uses the second undersampling factor, and the third k-space data is undersampled k-space data.

An undersampling factor is a ratio of k-space data with full sampling divided by the k-space data with undersampling. Still taking 256 rows of phase coding lines as an example, the k-space data with full sampling are all the data on the 256 rows of the phase coding lines. If data on 128 rows of the phase coding lines is collected during undersampling, the undersampling factor is 2; and if data on 64 rows of the phase coding lines is collected during undersampling, the undersampling factor is 4.

The third k-space data includes a collected part and an uncollected part. Still taking 256 rows of the phase coding lines as an example, if data on 128 rows of the phase coding lines are collected, the third k-space data may be a 256*256 matrix, in which rows corresponding to the collected 128 rows of the phase coding lines are filled with the collected data, and the remaining rows corresponding to the 128 rows of phase coding lines that are not collected are filled with zeros. More specifically, assuming that data on the odd-numbered rows of phase coding lines are collected, such as, the $1^{st}$, $3^{rd}$, $5^{th}$, $7^{th}$, . . . rows, the $1^{st}$, $3^{rd}$, $5^{th}$, $7^{th}$, . . . rows of data in the third k-space are collected data, and the $2^{nd}$, $4^{th}$, $6^{th}$, $8^{th}$ . . . rows are filled with zeros.

According to the application scenario of the DNN, such as abdominal scanning, the subject sample may be an abdomen of a human body. For the training sample set, there can be multiple subject samples, for example, abdominal magnetic resonance data of a plurality of patients can be collected.

Thus, as an example, the second undersampling factor may be an undersampling factor allowed by the accelerated magnetic resonance imaging method. The accelerated magnetic resonance imaging method described herein may be a parallel imaging accelerated imaging method, a compressed sensing accelerated imaging method, or a half-Fourier accelerated imaging method.

The parallel imaging is to use sensitivity information of coils to recover the information of the uncollected part, and an acceleration factor is generally determined by the number of coils in a direction. The acceleration factor is related to the undersampling factor. The larger the acceleration factor is, the larger the undersampling factor is. The lower the acceleration factor is, the lower the undersampling factor is. The direction refers to a phase coding direction of 2-dimensional MRI or a layer phase coding direction of 3-dimension MRI. For the abdominal scanning, since tissues in the abdomen are generally thick and large, to ensure penetration ability of a single coil, the size of the single coil will not be too small. Thus, to ensure the signal-to-noise ratio of MRI, the number of coils in the direction will not be too large. For scanning of other tissues, the acceleration factor of parallel imaging can be larger than that of the abdominal scanning.

There are two commonly used parallel imaging methods, one method is based on the image domain, which is called SENSitivity Encoding (SENSE), and the other method is based on the k-space domain, which is called GeneRalized Autocalibrating Partially Parallel Acquisition (GRAPPA). In general, parallel imaging has accelerated the scanning speed of MRI and is one of the most commonly used acceleration methods in MRI.

The compressed sensing technology is a reconstruction technology that breaks the Nyquist sampling law. A regular image reconstruction technology is to collect enough k-space data, with a sampling rate obeying the Nyquist sampling law, for reconstructing a desired magnetic resonance image. However, the compressed sensing technology applies when data on an image to be reconstructed or data after sparsifying transformation is sparse enough, and when the sampling process is in a random manner, and when it is possible to obtain an image with the same quality as that obeying the Nyquist sampling law by solving the constraint minimization problem. By sampling irregularly, artifacts are instead distributed as diffuse noise across the entire image that can later be removed. Because the center of the k-space contains more image information than its periphery, the compressed sensing technology can perform sampling on data with preferential sampling near the k-space center.

The half-Fourier method is also a commonly used acceleration method. Its main idea is to utilize the conjugate symmetry of k-space data to estimate uncollected k-space data through mathematical calculation, so as to achieve an effect of approaching full sampled k-space. The half-Fourier method collects only slightly more than half of the phase coding lines, so the scanning time can be reduced by nearly half. Data on the phase coding lines corresponding to the half-Fourier interval is collected. Data on the phase coding lines other than the half-Fourier interval is not collected, so the k-space data here may be filled with zeros At S102, a part of k-space data is selected from the third k-space data according to a first undersampling factor and a second sampling trajectory, to obtain fourth k-space data.

This step may be specifically: selecting a part of the k-space data from the third k-space data to obtain the fourth k-space data. Thus, the fourth k-space data is a part of the third k-space data, that is, a subset thereof. Therefore, the first undersampling factor of the fourth k-space data is larger than that of the third k-space data.

It can be known from the description of step S101 that the third k-space data includes the collected part and the uncollected part. In this step S102, selecting a part of the k-space data from the third k-space data is to select the part of the k-space data from the collected part of the third k-space data to fill the fourth k-space, with filling the other parts of the fourth k-space with zeros.

For different accelerated magnetic resonance imaging methods, the second sampling trajectory in this step can be different. For example, for the compressed sensing technology, to meet the sparse requirement, the second sampling trajectory is a sampling trajectory where data is collected randomly from the collected part of the third k-space data to obtain the fourth k-space data. For the parallel imaging technology, the second sampling trajectory can be a sampling trajectory where data is interlacedly selected. For example, when odd-numbered rows in the third k-space are collected data and the even-numbered rows are filled with zeros, the second sampling trajectory may refer to selecting rows, such as the $1^{st}$, $5^{th}$, $9^{th}$ . . . rows, from the odd-numbered rows in the third k-space to fill the fourth k-space. The $2^{nd}$, $3^{rd}$, $4^{th}$, $6^{th}$, $7^{th}$, $8^{th}$, $10^{th}$ . . . rows of the fourth k-space are filled with zeros. For the half-Fourier method, the second sampling trajectory needs to satisfy the conjugate symmetry of the k-space.

Compared with the complete k-space data, the fourth k-space data corresponds to an undersampling factor, that is, the first undersampling factor. Since the fourth k-space data is a part of the k-space data selected from the collected data of the third k-space, the first undersampling factor is larger than the second undersampling factor. The second undersampling factor may be an undersampling factor allowed by an accelerated magnetic resonance imaging method. The first undersampling factor can be larger than the undersampling factor allowed by the parallel imaging accelerated imaging method, the compressed sensing accelerated imaging method, or the half-Fourier accelerated imaging method.

More specifically, if the parallel imaging accelerated imaging method, the compressed sensing accelerated imaging method, or the half-Fourier accelerated imaging method allows an undersampling factor of 2, the first undersampling factor may be 3, 4, or other values larger than 2. Assuming that the first undersampling factor is 6 and the second undersampling factor is 2, the following descriptions are provided by still taking the 256 rows of the phase coding lines and parallel imaging accelerated imaging method as an example. Since the second undersampling factor is 2, at step S101, data corresponding to the odd-numbered rows of the phase coding lines may be collected. At step S102, since the k-space data are selected from the collected part of the third k-space data to be filled into the fourth k-space, and the fourth k-space data has an undersampling factor of 6, ⅓ of the data selected from the collected part of the third k-space data is filled into the fourth k-space. Therefore, a row of data can be selected every 3 odd-numbered rows to fill the fourth k-space. For example, the $1^{st}$, $7^{th}$, $13^{th}$, $19^{th}$, . . . rows of data of the third k-space can be filled into the fourth k-space, and the other rows of the fourth k-space data are filled with zeros.

The third k-space data can be considered as a small part of k-space data, and the fourth k-space data can be considered as an extremely small part of k-space data.

At S103, the third k-space data is taken as an output sample, and the fourth k-space data is taken as an input sample, to train a previously built DNN to obtain a DNN for accelerated magnetic resonance reconstruction.

This step can be specifically: inputting the third k-space data and the fourth k-space data into the previously built DNN, so that the previously built DNN deeply learns the third k-space data and the fourth k-space data to obtain a DNN for accelerated magnetic resonance reconstruction.

The third k-space data and the corresponding fourth k-space data can be referred as a training sample in a training sample set, and the training sample is input to the DNN for training. Then the DNN can be continued to be trained with other training samples. For the other training samples, the third k-space data and the corresponding fourth k-space data of other subjects can be obtained at steps S101-S102. When all training samples in the training sample set are used for training, that is, after completing a training epoch, it can be determined whether a stop condition is satisfied. When the stop condition is satisfied, the training is stopped, and parameter values of the DNN obtained at this time are optimized parameter values. When the stop condition is not satisfied, the DNN is continued to be trained with each sample in the sample set. Initial parameter values in each layer of the DNN, the iterative algorithm, the penalty function, and so on, can be set according to methods well known to those skilled in the art, which are not limited in this application.

In this implementation, the output samples of the DNN used for accelerated magnetic resonance imaging are not full sampled or enhanced full sampled k-space data, but undersampled data, and the undersampling factor of the undersampled data may be less than the undersampling factor allowed by an accelerated magnetic resonance imaging method. Therefore, the output samples for training the DNN can be obtained by an undersampling manner. Therefore, the output samples can be obtained in a short scanning time. Thus, the DNN can be applied to MRI application scenarios where the scanning time is limited, such as abdominal scanning.

Figure 2:
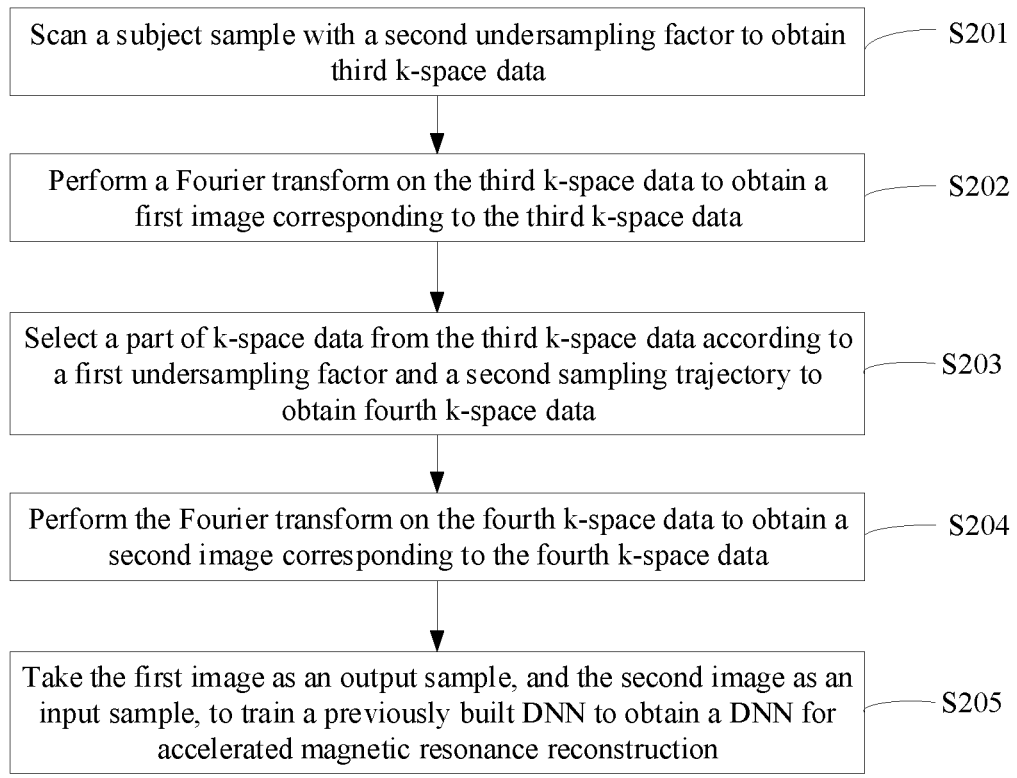
FIG. 2 is a schematic flowchart illustrating a method of training a deep neural network according to another example of the present application.

The above is a specific implementation of a method of training a DNN provided by an example of the present application. In this specific implementation, the description is made with the training sample set being k-space data in the k-space domain. Alternatively, the training sample set may also be images in the image domain A specific implementation of a method of training a DNN is described below by taking a training sample set being images in the image domain as an example. Referring to FIG. 2, an implementation of a method of training a DNN according to another example of the present application includes the following steps.

At S201, a subject sample is scanned with a second undersampling factor to obtain third k-space data.

This step is the same as S101, and for brevity, it will not be described in detail here.

At S202, a Fourier transform is performed on the third k-space data to obtain a first image corresponding to the third k-space data.

Since the third k-space data is undersampled data, the first image is also a magnetic resonance image with artifacts. Artifacts of the first image obtained by different accelerated magnetic resonance imaging methods can be different.

At S203, a part of the k-space data is selected from the third k-space data according to a first undersampling factor and a second sampling trajectory, to obtain fourth k-space data.

This step is the same as S102. For brevity, it will not be described in detail here.

At S204, the Fourier transform is performed on the fourth k-space data to obtain a second image corresponding to the fourth k-space data.

At S205, the first image is taken as an output sample, and the second image is taken as an input sample, to train a previously built DNN to obtain a DNN for accelerated magnetic resonance reconstruction.

The training process in this step is similar to step S103, except that the input sample is an image and the output sample is also an image. For a specific training process, reference can be made to step S103, and details are not described here.

For the two implementations of the above-mentioned methods of training a DNN, correspondingly, two implementations of magnetic resonance imaging methods are provided.

Figure 3:
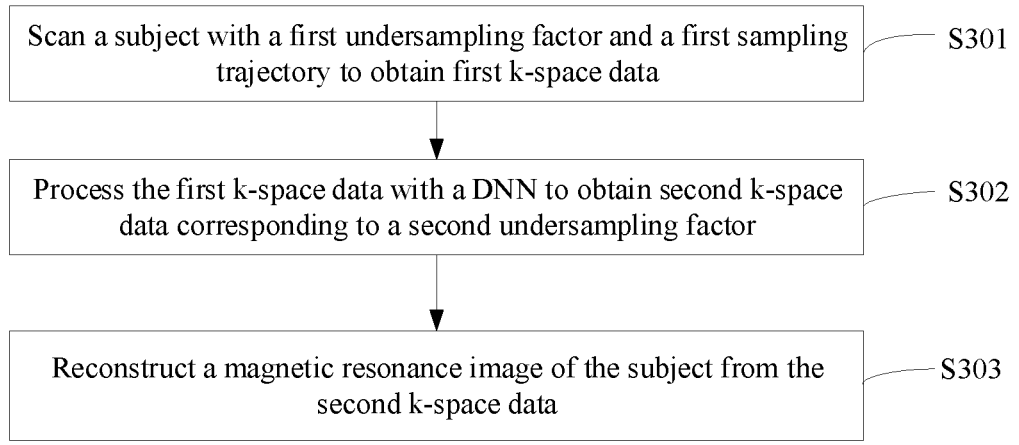
FIG. 3 is a schematic flowchart illustrating a method of magnetic resonance imaging according to an example of the present application.

FIG. 3 shows an example process of the magnetic resonance imaging method when the DNN is trained by the k-space data. The process of the magnetic resonance imaging method can include the following steps.

At S301, a subject is scanned with a first undersampling factor and a first sampling trajectory to obtain first k-space data.

As described above, the first undersampling factor may be larger than an undersampling factor allowed by an accelerated magnetic resonance imaging method. Since the larger the undersampling factor is, the fewer the sampling points are, and the shorter the scanning time is, in this application, by using an undersampling factor larger than that allowed by the accelerated magnetic resonance imaging method to collect magnetic resonance data, it can shorten the scanning time. This is useful for application scenarios with limited scanning time, such as abdominal scanning.

If the subsequent accelerated magnetic resonance imaging method is a parallel imaging method or a half-Fourier imaging method, the first sampling trajectory and the second sampling trajectory used in training are the same. If the subsequent accelerated magnetic resonance imaging method is a compressed sensing method, the first sampling trajectory may be slightly different from the second sampling trajectory used in training, because the compressed sensing method requires that sampling points are random and the sparse constraints are satisfied, At S302, the first k-space data is processed with the DNN to obtain second k-space data. The undersampling factor corresponding to the second k-space data is a second undersampling factor; and the first undersampling factor is larger than the second undersampling factor. The DNN can be associated with the first undersampling factor and the second undersampling factor.

The DNN is used to partially recover the second k-space data with a smaller undersampling factor by using the first k-space data with a larger undersampling factor.

The undersampling factor of the second k-space data is the second undersampling factor, and the second undersampling factor may be equal to or smaller than (no larger than) the undersampling factor allowed by the accelerated magnetic resonance imaging method. Thus, the accelerated magnetic resonance imaging method can be used to perform reconstruction according to the second k-space data subsequently to obtain a magnetic resonance image.

Assuming that the first undersampling factor is 6 and the second undersampling factor is 2. In this way, for the first k-space data, only ⅙ of data in the k-space is obtained by scanning the subject, and the remaining ⅚ of data is filled with zeros. After step S302, it can be considered that ⅓ of data is fitted or calculated by the DNN. Thus, for the second k-space data, ½ of data in the k-space is originally scanned, fitted or calculated, and the remaining ½ is 0. This process may also be called partially recovery.

At S303, the second k-space data is used for reconstructing a magnetic resonance image of the subject by using an accelerated magnetic resonance imaging method.

This step may be specifically: reconstructing the magnetic resonance image of the subject from the second k-space data by using a parallel imaging accelerated imaging method, a compressed sensing accelerated imaging method, or a half-Fourier accelerated imaging method.

A specific implementation for performing reconstruction according to the second k-space data by using a parallel imaging accelerated imaging method, a compressed sensing accelerated imaging method, or a half-Fourier accelerated imaging method may be accomplished according to an implementation well known to those skilled in the art. For example, for the parallel imaging acceleration imaging method, the SENSE method or the GRAPPA method may be used to reconstruct the second k-space data.

Further, the reconstruction method used at step S303 corresponds to the first sampling trajectory used at step S301. That is, if a certain reconstruction method is selected to be used at step S303, the first sampling trajectory selected at step S301 has to meet the requirements of the reconstruction method. For example, if the parallel imaging accelerated imaging method is to be used for reconstruction at step S303, the first sampling trajectory used for scanning the subject at step S301 should conform to a trajectory used by the parallel imaging accelerated imaging method, such as sampling in alternate rows.

The above is an implementation of the method of MRI provided by the examples of the present disclosure. In this implementation, the DNN and the accelerated magnetic resonance imaging method are combined in a sequence to jointly complete the imaging process from a small part of the k-space data to the magnetic resonance image.

This method can use the DNN to recover a small part of the k-space data from an extremely small part of the k-space data . Thus, when performing a magnetic resonance scan, the undersampling factor is no longer limited by the undersampling factor of the accelerated magnetic resonance imaging method. Accordingly, the collecting time of the imaging method can no longer be limited by the accelerated magnetic resonance imaging method, and can be significantly shortened. Therefore, this method can be very useful for magnetic resonance imaging in application scenarios where the scanning time is limited, which can expand the application scenarios of MRI.

The above is a specific implementation of a magnetic resonance imaging method corresponding to a DNN trained by k-space data.

Figure 4:
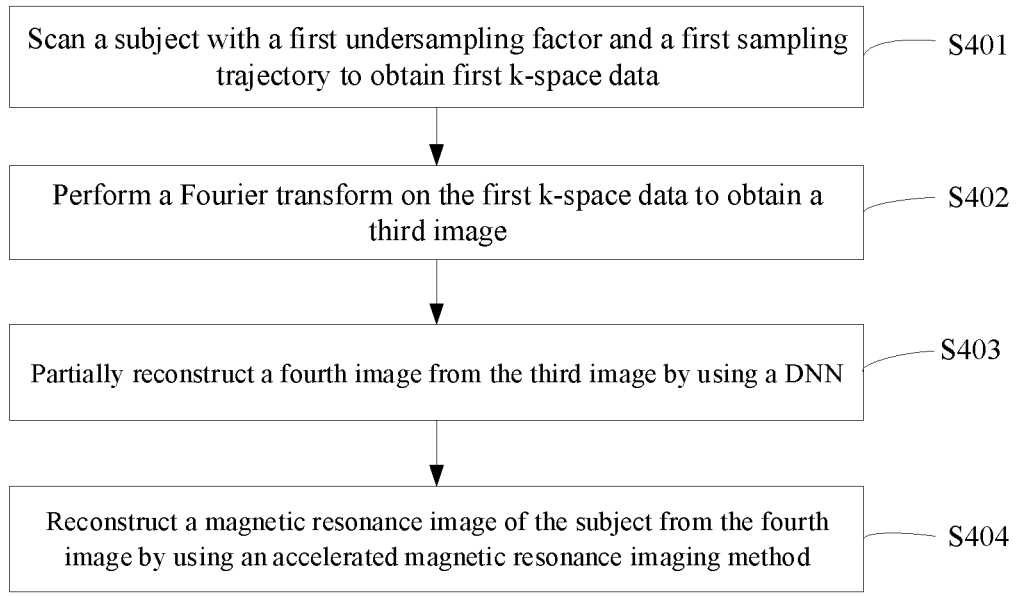
FIG. 4 is a schematic flowchart illustrating a method of magnetic resonance imaging according to another example of the present application.

The following describes a specific implementation of a magnetic resonance imaging method corresponding to a DNN trained by images. Referring to FIG. 4, the magnetic resonance imaging method includes the following steps.

At S401, a subject is scanned with a first undersampling factor and a first sampling trajectory to obtain first k-space data.

This step is the same as S301. For brevity, it will not be described in detail here.

At S402, a Fourier transform is performed on the first k-space data to obtain a third image.

It should be noted that the first k-space data and the third image correspond to each other. The difference between these two is that one is in the k-space domain and the other is in the image domain.

At S403, a fourth image is partially reconstructed from the third image by using a DNN, where an undersampling factor of k-space data corresponding to the fourth image is the second undersampling factor, and the first undersampling factor is larger than the second undersampling factor.

At S404, a magnetic resonance image of the subject is reconstructed from the fourth image by using an accelerated magnetic resonance imaging method.

The above is a specific implementation of the method of MRI provided by the examples of the present disclosure, where the used DNN is trained by images. The beneficial effects of this specific implementation are the same as that of the above specific implementation in FIG. 3, which will not be repeated here.

It can be known from the above that based on the specific implementations of the magnetic resonance imaging methods provided by the present application, it can realize the imaging process from a small part of the k-space data to the magnetic resonance image.

The magnetic resonance image can be an image with a high signal-to-noise ratio. Therefore, as an extended application of an example of the present application, multiple magnetic resonance images obtained by this method of MRI can be used as output samples for training another DNN, and correspondingly collected extremely small parts of the k-space data can be used as input samples for training the another DNN. Thus, the another DNN used for a process from an extremely small part of k-space data to a magnetic resonance image can be trained. The trained another DNN can also be used in a subsequent accelerated magnetic resonance imaging process which is from an extremely small part of k-space data to a magnetic resonance image. This extended application can ease the difficult to obtain a training set for a DNN.

In addition, in this method, an extremely small part of k-space data can be used for recovering a small part of k-space data by using the DNN, and then a magnetic resonance image is reconstructed from the small part of k-space data. Therefore, as another extended application of the example of the present application, multiple magnetic resonance images obtained by the method of MRI may be used as output samples for training another DNN, and multiple corresponding recovered small parts of the k-space data may be used as input samples for training the another DNN. Thus, the another DNN used for a process from a small part of k-space data to a magnetic resonance image can be trained. The trained another DNN can be used in a subsequent accelerated magnetic resonance imaging process which is from a small part of k-space data to a magnetic resonance image. This extended application can also ease the difficult to obtain a training set for a DNN.

Figure 5:
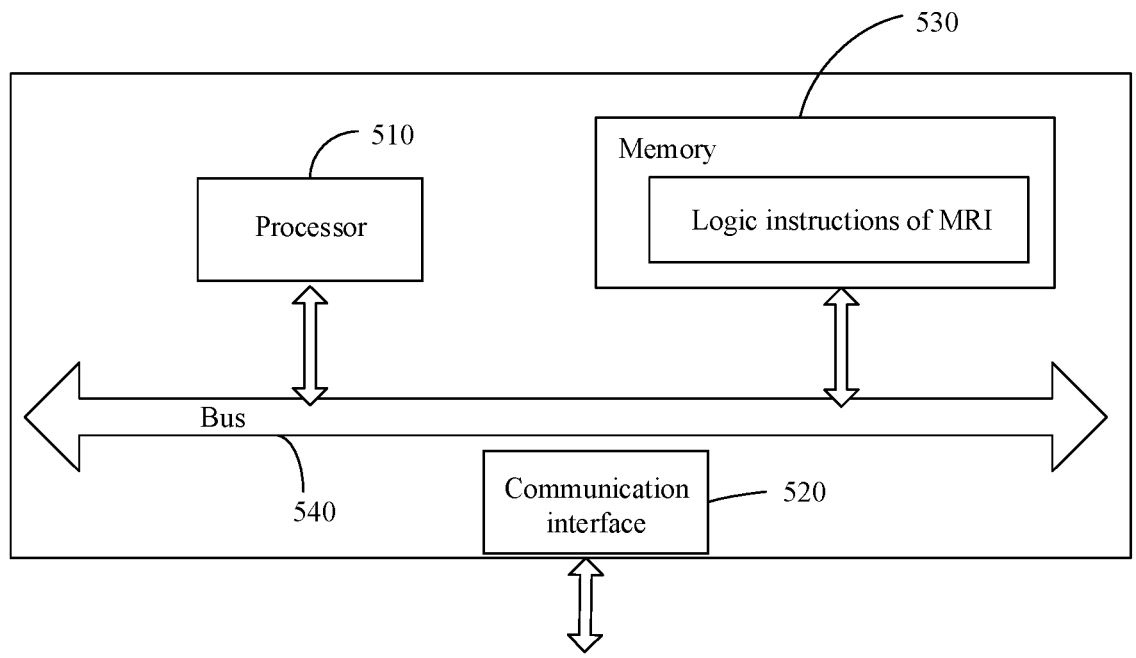
FIG. 5 is a schematic structural diagram illustrating an apparatus for performing a magnetic resonance imaging method according to an example of the present application.

The method of MRI in the above examples can be executed by an apparatus shown in FIG. 5. The apparatus shown in FIG. 5 includes a processor 510, and a memory 530. In some examples, a communications interface 520, and a bus 540 are also included in the apparatus. The processor 510, the communication interface 520, and the memory 530 communicate with each other through the bus 540.

The memory 530 can store logic instructions of magnetic resonance imaging, and the memory may be, for example, a non-volatile memory. The processor 510 may invoke and execute the logic instructions of magnetic resonance imaging in the memory 530 to execute a magnetic resonance imaging method as followings.

A coil of the magnetic resonance imaging apparatus is controlled to scan a subject with a first undersampling factor and a first sampling trajectory to obtain first imaging information; the first imaging information is processed with a deep neural network to obtain second imaging information, where a undersampling factor corresponding to the second imaging information is a second undersampling factor, and the first undersampling factor is larger than the second undersampling factor; and the second imaging information is used for reconstructing a magnetic resonance image of the subject.

If the function of the logic instructions of magnetic resonance imaging is implemented in the form of a software functional modules and sold or used as an independent product, it can be stored in a computer-readable storage medium. Based on such an understanding, the technical solution of the present disclosure, in its essence, or with the part contributing to the existing technology or a part of the technical solution, can be embodied in the form of a software product. The computer software product is stored in a storage medium, including several instructions to cause a computer device (which may be a personal computer, a server, or a network device, etc.) to perform all or part of the steps of the methods in the examples of the present application. The above storage media include: a U disk, a mobile hard disk, a read-only memory (ROM), a magnetic disk, or a compact disk and other media that can store program codes.

The above-mentioned logical instructions of magnetic resonance imaging can be divided into various functional modules. For details, reference can be made to the following examples.

Figure 6:
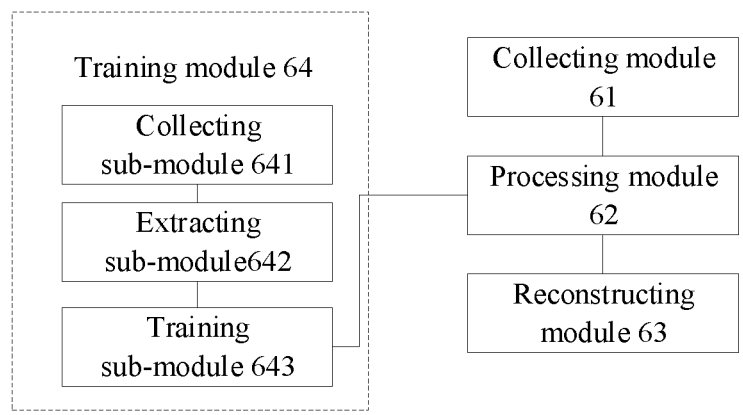
FIG. 6 is a block diagram illustrating function modules in an apparatus for magnetic resonance imaging according to an example of the present application.

Referring to FIG. 6, function modules in an apparatus for MRI provided by an example of the present application includes a collecting module 61, a processing module 62 and a reconstructing module 63.

The collecting module 61 configured to control a coil of the magnetic resonance imaging apparatus to scan a subject with a first undersampling factor and a first sampling trajectory to obtain first imaging information.

The processing module 62 configured to process the first imaging information with a deep neural network to obtain second imaging information, where an undersampling factor corresponding to the second imaging information is a second undersampling factor, and the first undersampling factor is larger than the second undersampling factor.

a reconstructing module 63 is configured to reconstruct a magnetic resonance image of the subject from the second imaging information.

In an example of the present application, the reconstructing module 63 may be configured to: reconstruct the magnetic resonance image from the second imaging information with a parallel imaging accelerated imaging manner, a compressed sensing accelerated imaging manner, or a half-Fourier accelerated imaging manner.

In an example of the present application, the apparatus may further include: a training module 64, configured to train the deep neural network in advance.

The training module 64 specifically includes the following sub-modules: a collecting sub-module 641, an extracting sub-module 642 and a training sub-module 643.

The collecting sub-module 641 configured to control the coil of the magnetic resonance imaging apparatus to scan a subject sample with the second undersampling factor to obtain third imaging information.

The extracting sub-module 642 configured to select a part of information from the third imaging information according to the first undersampling factor and a second sampling trajectory to obtain fourth imaging information.

The training sub-module 643 configured to take the third imaging information as an output sample and the fourth imaging information as an input sample to form a sample; and train the deep neural network based on a plurality of such samples.

In an example of the present application, when reconstructing the second imaging information with the parallel imaging accelerated imaging manner, the first sampling trajectory and the second sampling trajectory are the same.

In an example of the present application, when reconstructing the second imaging information with the half-Fourier accelerated imaging manner, the first sampling trajectory and the second sampling trajectory are the same.

In an example of the present application, when reconstructing the second imaging information with the compressed sensing accelerated imaging manner, both of the first sampling trajectory and the second sampling trajectory satisfy a sparse constraint condition.

In an example of the present application, the first imaging information and the second imaging information are k-space data in a k-space domain or images obtained by performing a Fourier transform on the k-space data.

In an example of the present application, the second undersampling factor is equal to or less than a undersampling factor of the parallel imaging accelerated imaging manner, the compressed sensing accelerated imaging manner, or the half-Fourier accelerated imaging manner.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A method of magnetic resonance imaging, the method comprising:
scanning a subject with a first undersampling factor and a first sampling trajectory to obtain first imaging information;
processing the first imaging information with a deep neural network (DNN) to obtain second imaging information corresponding to a second undersampling factor, the first undersampling factor being larger than the second undersampling factor; and
reconstructing a magnetic resonance image of the subject from the second imaging information,
wherein the DNN is trained with a plurality of training samples before processing the first imaging information with the DNN, and
wherein each training sample of the plurality of training samples is obtained by
scanning a subject sample with the second undersampling factor to obtain third imaging information,
selecting a corresponding part of information from the third imaging information according to the first undersampling factor and a second sampling trajectory to obtain fourth imaging information, and
taking the third imaging information as an output sample and the fourth imaging information as an input sample to form the training sample.

2. The method of claim 1, wherein reconstructing the magnetic resonance image of the subject from the second imaging information comprises:
reconstructing the magnetic resonance image from the second imaging information with one of parallel imaging accelerated imaging, compressed sensing accelerated imaging, and half-Fourier accelerated imaging.

3. The method of claim 1, wherein, when the magnetic resonance image of the subject is reconstructed from the second imaging information with parallel imaging accelerated imaging, the first sampling trajectory is same as the second sampling trajectory.

4. The method of claim 1, wherein, when the magnetic resonance image of the subject is reconstructed from the second imaging information with half-Fourier accelerated imaging, the first sampling trajectory is same as the second sampling trajectory.

5. The method according to claim 1, wherein, when the magnetic resonance image of the subject is reconstructed from the second imaging information with compressed sensing accelerated imaging, both the first sampling trajectory and the second sampling trajectory satisfy a sparse constraint condition of the compressed sensing accelerated imaging.

6. The method of claim 1, wherein the first imaging information and the second imaging information are parts of k-space data in a k-space domain.

7. The method of claim 1, wherein the first imaging information and the second imaging information are images obtained by performing a Fourier transform on parts of k-space data in a k-space domain.

8. The method of claim 1, wherein the second undersampling factor is no more than an undersampling factor for accelerated imaging.

9. An apparatus for magnetic resonance imaging, the apparatus comprising:
at least one processor; and
at least one non-transitory machine readable storage medium coupled to the at least one processor having machine-executable instructions stored thereon that, when executed by the at least one processor, cause the at least one processor to perform operations comprising:
controlling a coil of a magnetic resonance imaging apparatus to scan a subject with a first undersampling factor and a first sampling trajectory to obtain first imaging information;
processing the first imaging information with a deep neural network (DNN) to obtain second imaging information corresponding to a second undersampling factor, the first undersampling factor being larger than the second undersampling factor; and
reconstructing a magnetic resonance image of the subject from the second imaging information,
wherein the DNN is trained with a plurality of training samples before processing the first imaging information with the DNN, and
wherein each training sample of the plurality of training samples is obtained by
scanning a subject sample with the second undersampling factor to obtain third imaging information,
selecting a corresponding part of information from the third imaging information according to the first undersampling factor and a second sampling trajectory to obtain fourth imaging information, and
taking the third imaging information as an output sample and the fourth imaging information as an input sample to form the training sample.

10. The apparatus of claim 9, wherein reconstructing the magnetic resonance image of the subject from the second imaging information comprises:
reconstructing the magnetic resonance image from the second imaging information with one of parallel imaging accelerated imaging, compressed sensing accelerated imaging, and half-Fourier accelerated imaging.

11. The apparatus of claim 9, wherein, when the magnetic resonance image of the subject is reconstructed from the second imaging information with parallel imaging accelerated imaging, the first sampling trajectory is same as the second sampling trajectory.

12. The apparatus of claim 9, wherein, when the magnetic resonance image of the subject is reconstructed from the second imaging information with half-Fourier accelerated imaging, the first sampling trajectory is same as the second sampling trajectory.

13. The apparatus of claim 9, wherein, when the magnetic resonance image of the subject is reconstructed from the second imaging information with compressed sensing accelerated imaging, both the first sampling trajectory and the second sampling trajectory satisfy a sparse constraint condition of the compressed sensing accelerated imaging.

14. The apparatus of claim 9, wherein the first imaging information and the second imaging information are parts of k-space data in a k-space domain.

15. The apparatus of claim 9, wherein the first imaging information and the second imaging information are images obtained by performing a Fourier transform on parts of k-space data in a k-space domain.

16. The apparatus of claim 9, wherein the second undersampling factor is no more than an undersampling factor for accelerated imaging.

17. A non-transitory machine readable storage medium having machine-executable instructions stored thereon that, when executed by at least one processor, cause the at least one processor to perform operations comprising:
controlling a coil of a magnetic resonance imaging apparatus to scan a subject with a first undersampling factor and a first sampling trajectory to obtain first imaging information;
processing the first imaging information with a deep neural network (DNN) to obtain second imaging information corresponding to a second undersampling factor, the first undersampling factor being larger than the second undersampling factor; and
reconstructing a magnetic resonance image of the subject from the second imaging information,
wherein the DNN is trained with a plurality of training samples before processing the first imaging information with the DNN, and
wherein each training sample of the plurality of training samples is obtained by
scanning a subject sample with the second undersampling factor to obtain third imaging information,
selecting a corresponding part of information from the third imaging information according to the first undersampling factor and a second sampling trajectory to obtain fourth imaging information, and
taking the third imaging information as an output sample and the fourth imaging information as an input sample to form the training sample.

18. The non-transitory machine readable storage medium of claim 17, wherein reconstructing the magnetic resonance image of the subject from the second imaging information comprises:
reconstructing the magnetic resonance image from the second imaging information with one of parallel imaging accelerated imaging, compressed sensing accelerated imaging, and half-Fourier accelerated imaging.

19. The non-transitory machine readable storage medium of claim 17, wherein:
when the magnetic resonance image of the subject is reconstructed from the second imaging information with parallel imaging accelerated imaging or half-Fourier accelerated imaging, the first sampling trajectory is same as the second sampling trajectory, or
when the magnetic resonance image of the subject is reconstructed from the second imaging information with compressed sensing accelerated imaging, both the first sampling trajectory and the second sampling trajectory satisfy a sparse constraint condition of the compressed sensing accelerated imaging.

20. The non-transitory machine readable storage medium of claim 17, wherein the first imaging information and the second imaging information are one of:
parts of k-space data in a k-space domain, or
images obtained by performing a Fourier transform on parts of k-space data in a k-space domain.

* * * * *